United States Patent
Cleeves

(12) 
(10) Patent No.: US 6,515,923 B1
(45) Date of Patent: Feb. 4, 2003

(54) MEMORY ARRAY ORGANIZATION AND RELATED TEST METHOD PARTICULARLY WELL SUITED FOR INTEGRATED CIRCUITS HAVING WRITE-ONCE MEMORY ARRAYS

(75) Inventor: James M. Cleeves, Redwood City, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/002,268

(22) Filed: Nov. 15, 2001

Related U.S. Application Data

(62) Division of application No. 09/775,956, filed on Feb. 2, 2001, now Pat. No. 6,407,953.

(51) Int. Cl.$^7$ .................................................. G11C 7/00
(52) U.S. Cl. ................................... 365/201; 365/185.09
(58) Field of Search ............................ 365/201, 185.04, 365/185.09, 189.07

(56) References Cited

U.S. PATENT DOCUMENTS

| | | | | |
|---|---|---|---|---|
| 4,855,956 A | 8/1989 | Urai | ............................ | 365/210 |
| 4,972,372 A | 11/1990 | Ueno | ............................ | 365/201 |
| 5,331,594 A | 7/1994 | Hotta | ............................ | 365/201 |
| 5,400,344 A | 3/1995 | Mori | ............................ | 371/21.4 |
| 5,574,690 A | 11/1996 | Kesel | ............................ | 365/201 |
| 5,606,527 A * | 2/1997 | Kwack et al. | ............... | 365/201 |
| 5,764,576 A | 6/1998 | Hidaka et al. | ............... | 365/200 |
| 5,793,675 A | 8/1998 | Cappelletti et al. | .... | 365/185.09 |
| 5,903,489 A | 5/1999 | Hayano | ........................ | 365/51 |
| 6,111,801 A | 8/2000 | Brady | .......................... | 365/201 |
| 6,370,070 B1 * | 4/2002 | Chevallier et al. | .......... | 365/201 |

* cited by examiner

*Primary Examiner*—Tan T. Nguyen
(74) *Attorney, Agent, or Firm*—Zagorin, O'Brien & Graham, LLP

(57) ABSTRACT

In a preferred integrated circuit embodiment, a write-once memory array includes at least one test bit line which provides a respective test memory cell at the far end of each respective word line relative to its word line driver, and further includes at least one test word line which provides a respective test memory cell at the far end of each respective bit line relative to its bit line driver. An intra-layer short between word lines may be detected, such as during manufacturing testing, by biasing adjacent word lines to different voltages and detecting whether any leakage current flowing from one to another exceeds that normally accounted for by the memory cells and other known circuits. Intra-layer bit line shorts and inter-layer word line and bit line shorts may also be similarly detected. An "open" in a word line or bit line may be detected by trying to program the test memory cell at the far end of each such word line or bit line. If successfully programmed, the continuity of each word line and bit line is assured, and the programming circuitry for each word line and bit line is also known to be functional.

40 Claims, 10 Drawing Sheets

MEMORY ARRAY ORGANIZATION AND RELATED TEST METHOD PARTICULARLY WELL SUITED FOR INTEGRATED CIRCUITS HAVING WRITE-ONCE MEMORY ARRAYS

This application is a Divisional of co-pending Application No. 09/775,956 filed Feb. 2, 2001, now U.S. Pat. No. 6,407,953 the enitirety of which is incorporated herein by reference.

BACKGROUND OF THE INVENTION

1. Field of the Invention

The present invention relates to semiconductor integrated circuits having memory cells arrays, and particularly to three-dimensional arrays incorporating multiple levels of memory cells.

2. Description of the Related Art

Manufacturers of integrated circuits that include write-once memory arrays (also known as one-time programmable, or OTP memory arrays) face a difficult test problem. The memory cells of the array must be assured of being successfully programmed by a subsequent user, but the manufacturer cannot program the memory cells during the testing procedures to confirm that each memory cell can be programmed, because the memory cells, once written, cannot be re-written or erased before shipping to an end user of the integrated circuit.

Traditionally, several techniques have been utilized to increase the assurance level that a memory array, once shipped, will indeed be programmable by an end user. In one such technique, extra memory cells may be implemented outside the memory array whose characteristics may be measured and which may be programmed during a manufacturer's test procedures to confirm generally the integrity of the memory cells on each integrated circuit die. Such extra memory cells may be implemented individually in the periphery of an integrated circuit, or may be implemented as a small test memory array in the periphery of an integrated circuit, or may be implemented in a dedicated test die which is occasionally stepped into the wafer, or even implemented in the scribe streets between individual integrated circuit dies on a wafer. While such a structure may provide adequate general characterization of the memory cells formed nearby, it provides no assurance against individual defects that may affect isolated memory cells or individual rows or columns of memory cells.

Because of the inability to provide total assurance of a memory array, manufacturers sometimes warranty a device to be fully programmable for at least a specified percentage of the memory cells. For example, a memory device may carry a warranty to be at least 98% programmable, or the device may be returned for credit. While this scheme protects an end user from the cost of buying a defective part, in essence the final test function has been shifted to the end user, who must either accommodate devices having an unpredictable capacity, or must be prepared to return defective devices.

With the increasing importance of write-once memory devices, there remains a continued need for improved techniques for testing devices that include a write-once memory array.

SUMMARY OF THE INVENTION

In an integrated circuit having a memory array, a short between a word line and an adjacent word line may be detected by biasing adjacent word lines to different voltages, and detecting any leakage current flowing therebetween. If the current is higher than what would be attributable to leakage currents through normally behaved memory cells, and any other expected source of leakage current, the word lines may be deemed to be shorted together. Individual word lines may be sequentially biased to a first voltage, with all other word lines biased to a second voltage different from the first voltage, which allows a shorted word line to be localized within the array. Alternatively, groups of alternating word lines may be biased to the first voltage, and the adjacent word lines biased to the second voltage, to more quickly determine if a shorted word line exists anywhere within the group of word lines.

Shorted bit lines may be determined in like manner. A short between a bit line and an adjacent bit line may be detected by biasing adjacent bit lines to different voltages, and detecting any leakage current flowing therebetween. The bit lines may be biased to a first voltage individually, or in groups of alternating bit lines (i.e., every other bit line in a group). As with detecting word line shorts, a current detector may be implemented in any of several convenient points within a current path formed by the shorted word line or bit line. Such a detector may respond with an output signal whenever the detected current exceeds a predetermined value, or may be implemented as a measurement circuit to quantify the magnitude of the current.

A short between one or more word lines on a given layer or level of the memory array and one or more bit lines on an adjacent layer of the memory array may also be detected by biasing the word lines to a different voltage than that to which the bit lines are biased. In a three-dimensional memory having at least more than one layer of word lines and/or more than one layer of bit lines (i.e., having at least two layers of memory cells, each formed between a word line layer and a vertically adjacent bit line layer), inter-layer word line shorts may also be detected by biasing word lines on different layers to different voltages and detecting any unexpected leakage current.

The above stated techniques for detecting either intra-layer shorts on word lines and/or bit lines, inter-layer shorts between word lines and bit lines, or between different layers of word lines or different layers of bit lines, arguably presume that each such word line or bit line is continuous across the memory array so that a short located, for example, at a "far end" of a word line (relative to its driver or biasing circuit) can therefore be actually detected. If an "open" (i.e., an open circuit) exists in such a word line that is shorted to its neighbor, the short could not be detected if located "beyond" the location of the "open."

However, a word line may be confirmed to be continuous across a memory array by programming a memory cell located at the far end of the word line relative to its programming driver. A test bit line is preferably included in the array which provides a respective test memory cell between each respective word line and the test bit line, and which is preferably located along the side of the memory array opposite the word line drivers for the respective word lines. If each test memory cell in the test bit line can be successfully programmed, this ensures that each word line is continuous (i.e., has no "opens" in it) and also confirms that each word line's programming driver is functioning properly. Moreover, it also ensures that the metallization or other conductive material forming the word line has a low enough impedance to pass an adequately high voltage all the way across the memory array to the test memory cell being programmed, and further can carry enough current across the memory array to adequately program the test memory cell.

Similarly, a test word line is preferably included in the array which provides a respective test memory cell between each respective bit line and the test word line, and which is preferably located along the side of the memory array opposite the bit line drivers for the respective bit lines. If each test memory cell in the test word line can be successfully programmed, this ensures that each bit line is continuous and that each bit line's programming driver is functioning properly. Moreover, it also ensures that the metallization or other conductive material forming tie bit line has a low enough impedance to develop an adequately high voltage across the test memory cell located all the way across the memory array, and further assures that the bit lines can carry enough current across the memory array to adequately program the test memory cell.

If the corresponding test memory cell on the far end of each word line and bit line in the array is successfully programmed, which confirms the continuity of each of the word lines and bit lines, then the shorts test described earlier can be deemed to have confirmed that no shorts exist within the entire memory array. Moreover, every programming driver circuit for both word lines and bit lines is also confirmed to be functional. If memory cells in the regular memory array are read, every bit in the array can be verified to have not been inadvertently programmed during the programming of the test memory cells, particularly since the array is then known to have no opens or shorts on either bit lines or word lines.

In another embodiment of the present invention, the test cells may be detected without actually programming the test cells. For example, an antifuse memory cell may be biased to a voltage below that sufficient to program the memory cell, but still cause a relatively predicable current to flow through the memory cell. The presence of the memory cell, and the continuity of the word line and bit line associated with the memory cell, may be confirmed by detecting such a characteristic current flowing through each unprogrammed test memory cell at the far end of the word line and/or bit line.

In another embodiment of the invention, each regular memory cell may be addressed and biased to a voltage below that sufficient to program the memory cell to determine if the characteristic current actually flows through the memory cell. The presence of each regularly addressable memory cell may be confirmed by detecting such a characteristic current flowing through each unprogrammed memory cell within the array.

In an exemplary circuit embodiment, the memory array defect information, once determined by the manufacturer, may be written into a defect table provided on-chip. This defect table may subsequently be read by an end user of the circuit to determine which portions of the array should not be used, such as defective blocks, pages, or some other suitably-identifiable portion of the array. The defect table is preferably a write once structure, but is advantageously combined with an erasable of write-once memory array.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
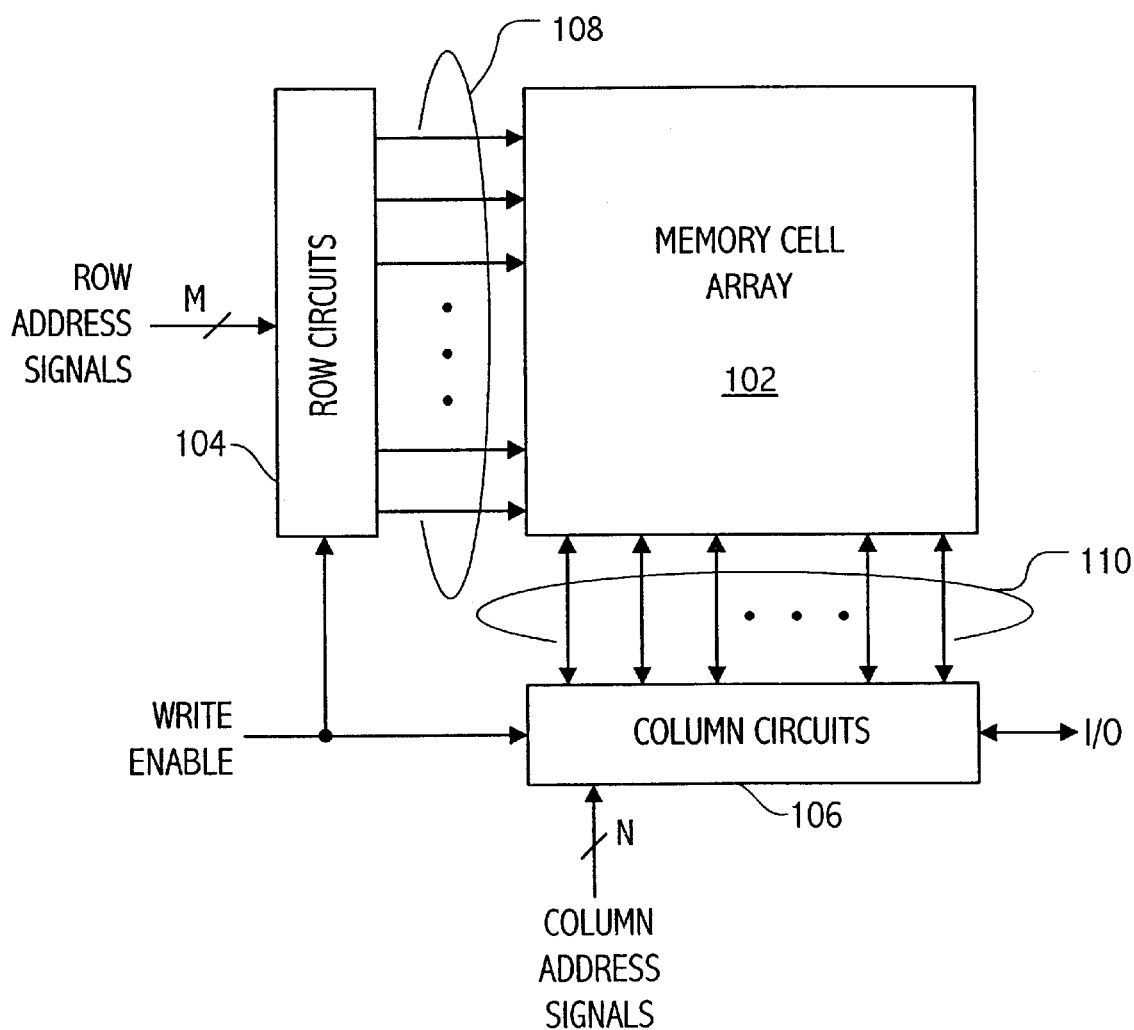
FIG. 1 is a simplified block diagram of an integrated circuit including a memory array.

Referring now to FIG. 1, a block diagram is shown of an integrated circuit 100 including a memory array 102, which diagram may be useful to depict several preferred embodiments of the present invention. In one such embodiment, the memory array 102 is preferably a three-dimensional, field-programmable, non-volatile memory array having more than one level of memory cells, and which utilizes a read voltage different in magnitude from a write voltage. Preferred three-dimensional memory arrays are disclosed in commonly-assigned U.S. Pat. No. 6,034,882, entitled "vertically Stacked Field Programmable Nonvolatile Memory and Method of Fabrication," which patent is incorporated herein by reference in its entirety. Another preferred three-dimensional, field-programmable, non-volatile memory array technology is disclosed in co-pending, commonly-assigned U.S. patent application Ser. No. 09/560,626, entitled "Three-Dimensional Memory Array and Method of Fabrication," filed Apr. 28, 2000 and naming as inventor N. Johan Knall, which application is incorporated herein by reference in its entirety.

In the presently described preferred embodiment, array 102 is a three-dimensional, non-volatile, write-once memory array of passive element memory cells, although other memory arrays are also suitable. Each passive element memory cell within the memory array 102 is preferably a two-terminal memory cell having a steering element in series with a state change element, together connected between two usually orthogonal (but not necessarily so) array terminal lines, as described in the above-cited references. These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

The array terminal lines at one level may be termed word lines or X-lines. The array terminal lines at a vertically adjacent level may be termed bit lines or Y-lines. A memory cell is formed at the intersection of each word line and each bit line, and is connected between the respective intersecting word line and bit line. A three-dimensional memory array which has at least two levels of memory cells may utilize at least more than one layer of word lines or more than one layer of bit lines. A group of word lines, each residing on a separate layer (i.e., level) and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

The array terminals of memory array 102 include the various layer(s) of word lines organized as rows, and the various layer(s) of bit lines organized as columns. The integrated circuit 100 includes a row circuits block 104 whose outputs 108 are connected to respective word lines of the memory array 102. The row circuits block 104 receives a group of M row address signals, various control signals such as a WRITE ENABLE signal shown, and typically may include such circuits as row decoders and array terminal drivers for both read and write (i.e., programming) operations. The integrated circuit 100 also includes a column circuits block 106 whose input/outputs 110 are connected to respective bit lines of the memory array 102. The column circuits block 106 receives a group of N column address signals, various control signals such as the WRITE ENABLE signal shown, and typically may include such circuits as column decoders, array terminal receivers, read/write circuitry, and I/O multiplexers. Circuits such as the row circuits block 104 and the column circuits block 106 may be collectively termed array terminal circuits for their connection to the various terminals of the memory array 102.

Integrated circuits incorporating a memory array usually subdivide the array into a sometimes large number of sub-arrays. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. As used herein, an integrated circuit may include one or more than one memory array.

Figure 2:
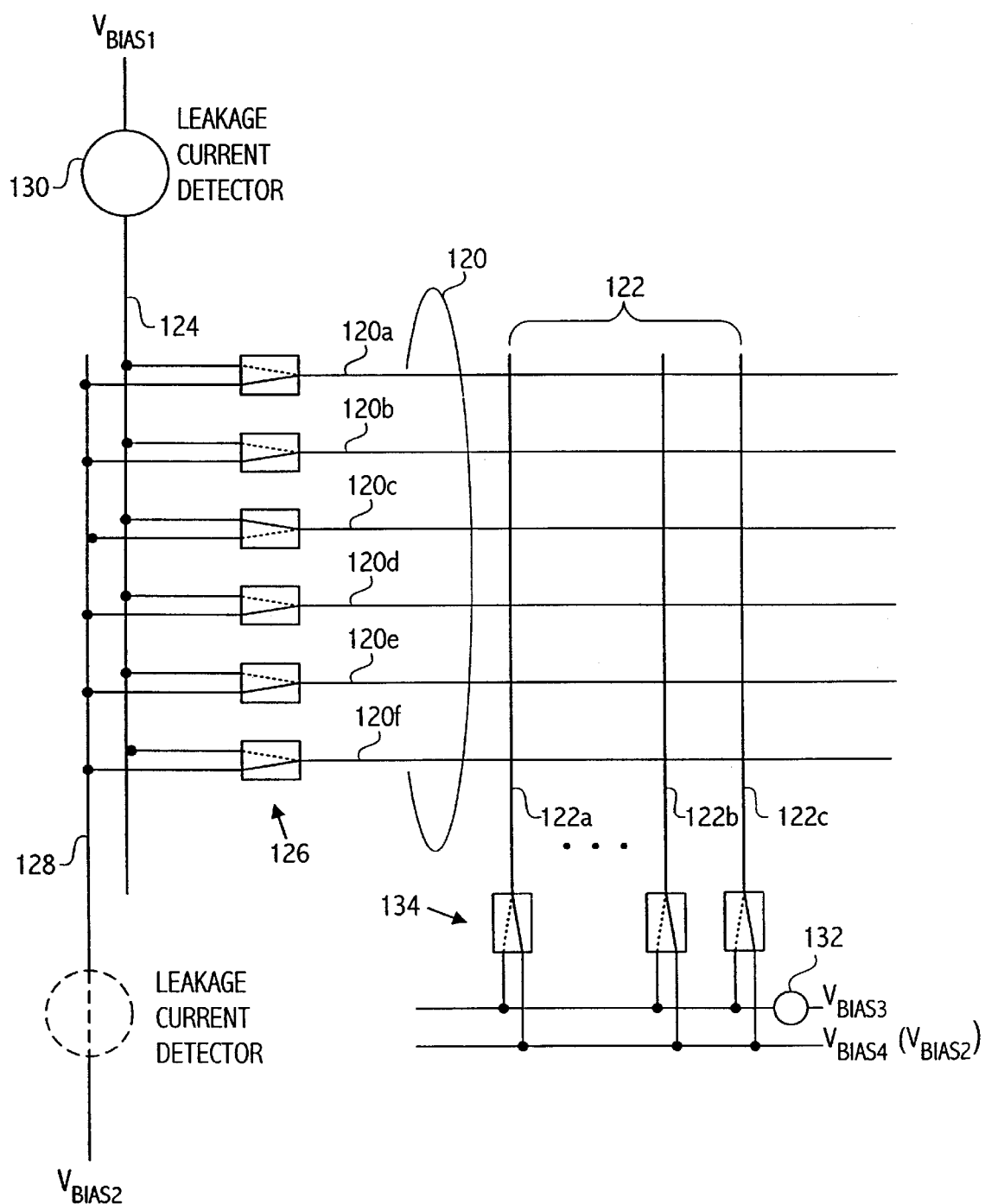
FIG. 2 is a conceptual block diagram of a memory array illustrating an advantageous biasing of word lines and bit lines in accordance with an embodiment of the present invention.

FIG. 2 depicts a representation of a single layer of word lines 120 and a single layer of bit lines 122. In this example, six word lines 120a–120f are shown, and three bit lines 122a–122c are shown. It is understood that many more such word lines and bit lines are usually encountered in a memory array, but the few shown are sufficient to describe the invention. A short between two adjacent word lines may be detected by biasing adjacent word lines to different voltages, and detecting whether any leakage current flows from one to the other whose magnitude is higher than that attributable to memory cells or other anticipated circuits.

Conceptually, such a capability may be implemented by a group of switches 126, each for coupling a respective word line to one of either a first bias voltage $V_{BIAS1}$ communicated along a first bus 124 or to a second bias voltage $V_{BIAS2}$ communicated along a second bus 128. For example, with the switches 126 configured as shown, the word line 120c is biased to the $V_{BIAS1}$ voltage, while its two adjacent word lines 120b and 120d are biased to the $V_{BIAS2}$ voltage (as are the other word lines 120a, 120e, and 120f, as well). A leakage current detector 130 is included along the bus 124 to detect current in the conductive path from the $V_{BIAS1}$ bias voltage to the switches 126, and consequently to detect current flow between word line 120c and either or both word lines 120b and 120d. Alternatively, such a leakage current detector 130 may be located in the bus 128 to detect current in the conductive path from the switches 126 to the $V_{BIAS2}$ bias voltage.

If the word line 120c is "shorted" to either or both of its adjacent word lines 120b and 120d, for example due to a manufacturing defect in the metallization or other conductive layer forming the word lines, or due to a manufacturing defect in a layer or structure forming the memory cells, a current will flow having a magnitude dependent upon the impedance of the "short" between the word lines. A current detector, such as leakage current detector 130, may be incorporated to detect leakage current greater than a predetermined magnitude, which magnitude could be chosen to be greater than an allowable magnitude of leakage current usually encountered between adjacent word lines, but less than the magnitude of current which would indicate a manufacturing flaw or defect in one or more of the layers or structures within the memory array.

If the bit lines are biased to an appropriate bias voltage, such as a $V_{BIAS4}$ voltage as shown, when the word line 120c is biased to the $V_{BIAS1}$ voltage, a short between the word line 120c and any of the bit lines may be detected as well. The leakage current detector 130 may be used to detect any leakage current exceeding a predetermined magnitude which may be flowing through a short between the word line 120c and any (or all) of the bit lines 122a, 122b, and 122c. Such a short may result from a dielectric defect allowing metallization or other conductive material to form between a bit line and a word line, or may result from a defect within a memory cell structure, such as a diode or antifuse structure, which may cause the intended structure to behave as a leaky resistor, or may result from yet some other cause or defect. The bit line bias voltage $V_{BIAS4}$ is preferably chosen to be the same magnitude as the word line bias voltage $V_{BIAS2}$. Alternatively, one or both of the voltages to which the bit lines may be biased (shown here as $V_{BIAS3}$ and $V_{BIAS4}$) may be chosen to have a different magnitude from either or both of the two word line bias voltages (shown here as $V_{BIAS1}$ and $V_{BIAS2}$), depending upon the characteristics of the memory cells incorporated within the array.

Control circuitry may be easily accomplished to sequence through each word line, individually connecting each respective word line to one of the bias voltages, while all other word lines are biased to the second bias voltage. By doing so, the general location of a short may be determined.

Alternatively, every other word line may be connected to the first bias voltage $V_{BIAS1}$, while the remaining word lines are connected to the second bias voltage $V_{BIAS2}$. If any shorts exist between any adjacent word line(s), a corresponding leakage current will flow from the bias voltage source having the higher magnitude to the lower bias voltage source. A current detector in series with this aggregate current path can then detect when enough leakage current flows to deem the array as having one or more adjacent word lines shorted together. If desired, a subsequent test can then sequence through each word line (or groups of alternating word lines) to help localize the short and determine its extent.

Similarly, another test sequence may be provided to sequence through each bit line, for example, individually connecting each respective bit line to one of its bias voltages, while all other bit lines are biased to the other of its bias voltages. By doing so, the general location of a bit line short may be determined. Alternatively, every other bit line may be connected to a first bit line bias voltage $V_{BIAS3}$, while the remaining bit lines are connected to a second bit line bias voltage $V_{BIAS4}$. If any shorts exist between any adjacent bit line(s), a corresponding leakage current will flow from the bit line bias voltage source having the higher magnitude to the lower bit line bias voltage source. A current detector in series with this aggregate current path (e.g., detector 132 as shown) can then detect when enough leakage current flows to deem the array as having one or more adjacent bit lines shorted together. If desired, a subsequent test can sequence through each bit line (or groups of alternating bit lines) to help localize the short and determine its extent.

Figure 3:
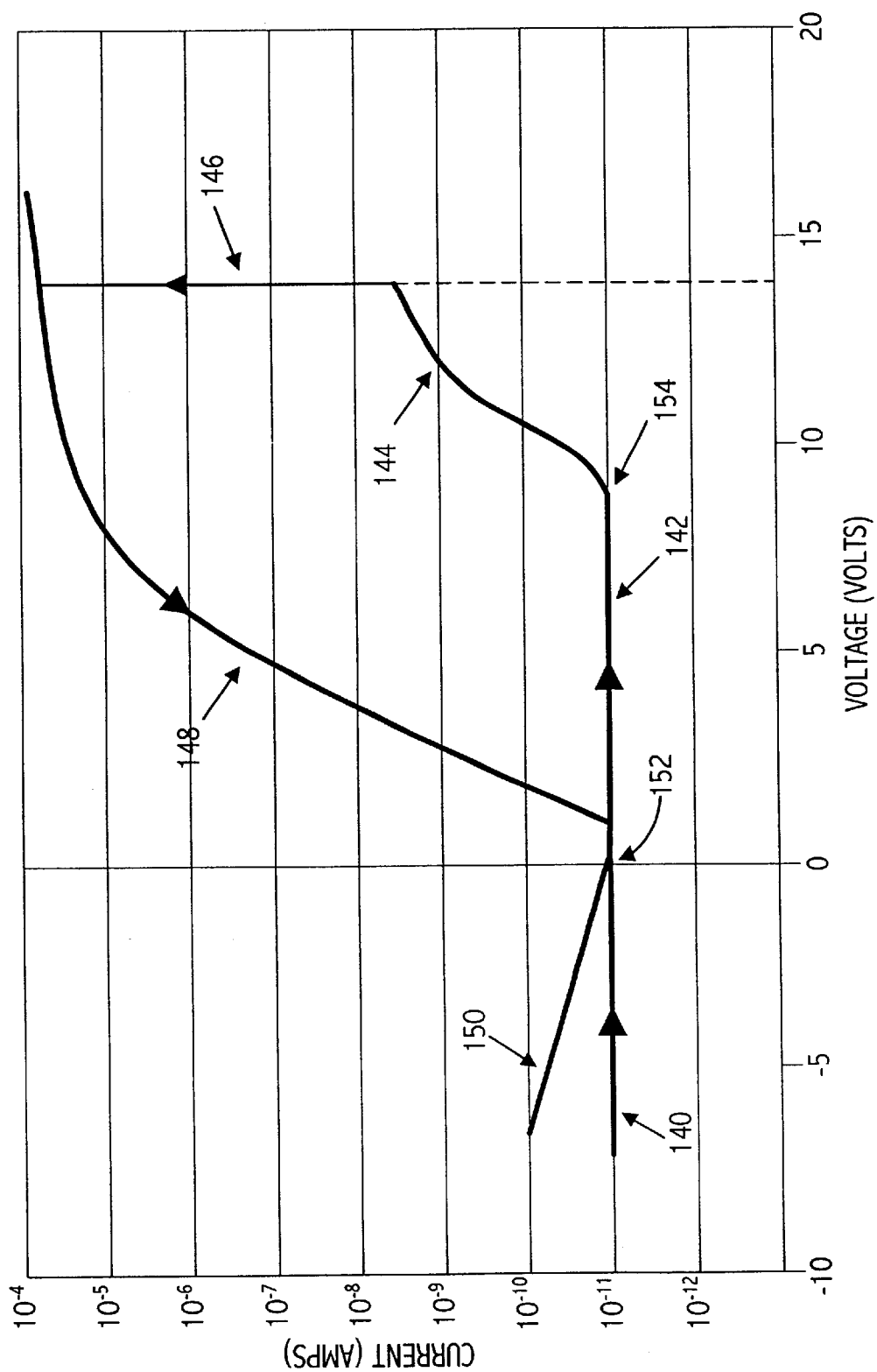
FIG. 3 is a waveform graph depicting the I-V characteristic of an exemplary antifuse memory cell.

The polarity of the bias voltage impressed between a word line on a given layer and a bit line on an adjacent layer above or below the word line, as well as the magnitude of such a bias voltage, must be chosen mindful of the memory cell which is formed between the word line and the bit line. At some magnitude of bias voltage, the memory cell will likely itself support a current flow between the word line and the bit line. Referring now to FIG. 3, a graph is shown to illustrate the I-V characteristic of a preferred two-terminal antifuse memory cell before, during, and after programming. Before programming, the current through such a memory cell is relatively independent of the voltage across the memory cell, at least for low voltages. For example, region 140 depicts a relatively small reverse-bias voltage (with respect to a steering element within the memory cell) applied across the memory cell, and region 142 depicts a relatively small forward-bias voltage applied across the memory cell. In both cases the current is relatively non-existent, and the indicated value of the measurement (e.g., 10 pA) likely limited by the instrumentation equipment. The measured current in both region 140 and 142 is approximately equal to the indicated current flow with no voltage applied (labeled as 152) because the state change element within an unprogrammed antifuse memory cell closely approximates an open circuit.

At some point, however, as the forward bias voltage is increased, current begins to flow through the unprogrammed memory cell, here labeled as point 154 which, for the exemplary memory cell shown, is about 8 volts. As the voltage increases, additional current flows through the memory cell until, when a sufficiently high voltage is reached (shown here at about 13 volts), the state change element within the memory cell suddenly changes state to a much lower resistance and the current through the memory cell jumps several orders of magnitude (labeled as 146) to a much higher "programmed" current (e.g., which may be approximately 100 $\mu$A). This programmed current exhibits a shape much more diode-like in character when forward biased (region 148) and when reversed biased (region 150).

At a voltage below that sufficient to program the memory cell, but high enough to cause some current to flow, the memory cell may exhibit a predictable characteristic current. For example, at the point labeled 144, the current is two orders of magnitude higher than its normal unprogrammed level, yet is over four orders of magnitude less than the programmed level of current. If such a characteristic current is observed flowing through a memory cell in the array, such a memory cell is more than likely a well-behaved memory cell that is likely to program predictably at its expected programming voltage. If the measured current is either well below or well above the usual characteristic current, it may be desirable to reject the memory cell (i.e., deem it to be defective). Such a characteristic current may be preferably measured or detected at a bias voltage across the memory cell which is approximately 60–80% of the expected programming voltage of the memory cell.

The biasing techniques described above with reference to FIG. 2 for detecting either intra-layer shorts on word lines and/or bit lines, inter-layer shorts between word lines and bit lines, or (if a three-dimensional array) between different layers of word lines or different layers of bit lines, arguably presume that each such word line or bit line is continuous across the memory array so that a short located, for example, at a "far end" of a word line (relative to its driver or biasing circuit) can therefore be actually detected. If an "open" (i.e., an open circuit) exists in such a word line that is shorted to its neighbor, the short could not be detected with just the biasing techniques described if located "downstream" of the open circuit in the word line.

Figure 4:
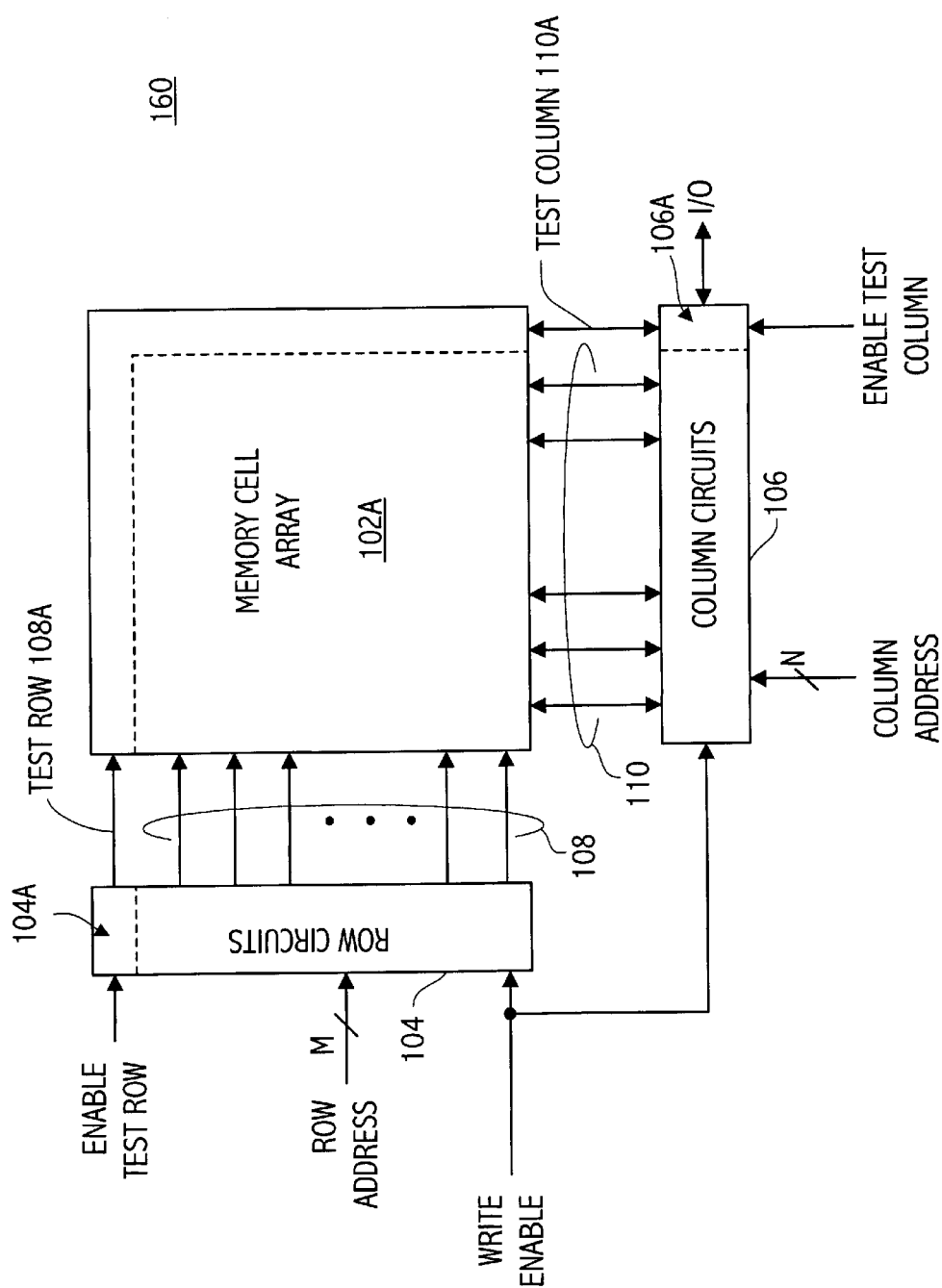
FIG. 4 is a simplified block diagram of an integrated circuit including a memory array having a test row and test column in accordance with an embodiment of the present invention.

However, a word line may be confirmed to be continuous across a memory array by programming a memory cell located at the far end of the word line relative to its programming driver. Referring now to FIG. 4, an integrated circuit 160 is shown which is similar to that shown in FIG. 1 but whose memory cell array 102A includes a test column 110A located along the right side of the memory array opposite the row circuits block 104. For the exemplary embodiment utilizing a three-dimensional memory array, the test column 110A preferably includes a test bit line on each layer having "regular" bit lines, and provides a respective test memory cell between each of the word line(s) of each respective row of the array and a corresponding test bit line of the test column. A separate test column circuit block 106A is provided to interface with the bit line(s) within the test column 110A. The test column is not normally addressable by a decoded address received by the column circuits block 106, but is preferably enabled independently, such as by a separate ENABLE TEST COLUMN signal, or by another suitable technique.

The memory cell array 102A further includes a test row 108A located along the top of the memory array opposite the column circuits block 106. The test row 108A preferably includes a test word line on each layer having "regular" word lines, and provides a respective test memory cell between each of the bit line(s) of each respective column of the array and the corresponding test word line of the test row. A separate test row circuit block 104A is provided to interface with the word line(s) within the test row 108A. The test row is not normally addressable by a decoded address received by the row circuits block 104, but is preferably enabled independently, such as by a separate ENABLE TEST ROW signal, or by another suitable technique.

Figure 5:
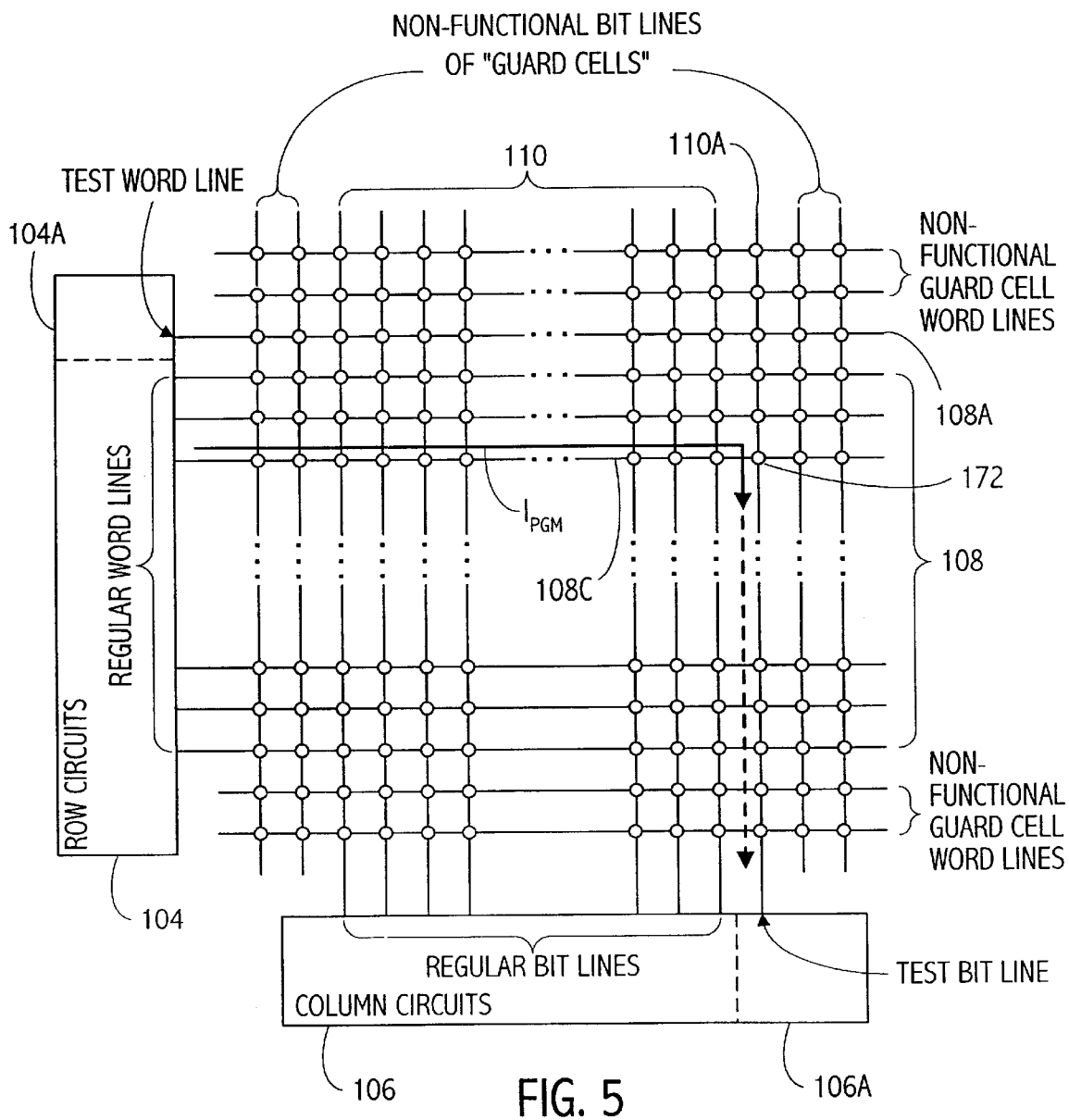
FIG. 5 is a simplified block diagram of a memory array as in FIG. 4, and showing individual word lines and bit lines.

While the above description sets forth a test row and test column in the context of an exemplary three-dimensional memory array having at least more than one word line layer or more than one bit line layer, the advantages of the invention may be readily apparent, and may be more easily described, in the context of a memory array having a single layer (or level) of word lines and a single layer of bit lines, which together are associated with a single layer of memory cells. FIG. 5 depicts such a memory array, and illustrates individual word lines 108 and individual bit lines 110. Also shown is a single test bit line 110A and a single test word line 108A. Each circle at the intersection of a respective word line and a respective bit line represents a respective memory cell coupled therebetween. It should be appreciated that the word lines are implemented typically on one layer, and the bit lines implemented on a vertically adjacent layer either above of below the word line layer in the semiconductor processing sequence.

It is well known in the art to include additional memory cells, frequently known as "guard cells," around the periphery of a memory array to ensure that the otherwise outermost row and column of memory cells maintain lithographic uniformity with the remaining memory cells of the array. A respective pair of non-functional guard cell word lines is depicted at both the top and bottom of the memory array, and a respective pair of non-functional guard cell bit lines is depicted at both the left and right sides of the memory array. The test word line 108A is located on the side of the memory array opposite the column circuits block 106, and is thus at the "far end" of the bit lines relative to the bit line drivers within the column circuits block 106, although it is preferably located inside the guard cell word lines, as shown. As used herein, being located at a "far end" of a bit line (and similarly for a word line) should not necessarily be interpreted to require location at the literal end of the bit line beyond a non-functional guard cell word line. With this understanding, subsequent figures do not specificly depict guard cells and their associated non-functional word lines and bit lines, although it should be understood that such are preferably implemented.

For each normally addressable word line in the array, the test memory cell at the far end of the word line, which is coupled to the test bit line, is programmed during the test routine, by enabling the row circuits block 104 to decode and drive the selected word line, and by enabling the test column circuits block 106A to drive the test bit line, thereby programming (or attempting to program) the test memory cell coupled between the selected word line and the test bit line. For example, FIG. 5 depicts a test memory cell at the far end of word line 108c being programmed. To program this memory cell, the selected word line 108c is preferably coupled by a programming driver within the row circuits block 104 to a programming voltage source $V_{PP}$ (not shown). The magnitude of such a programming voltage source may be 5 to 20 volts, depending upon the structure of the particular memory cell technology incorporated within the memory array. The test bit line 110A is preferably coupled to ground by a programming driver within the test column circuits block 106A, thus impressing substantially the entire $V_{PP}$ voltage across the test memory cell 172, which causes the antifuse to "pop" and suddenly become dramatically more conductive. This increased conductivity results in a programmed current $I_{PGM}$ flowing all the way across the memory array through the word line 108c, through the test memory cell 172, and along the test bit line 110A to the test column circuits block 106A. The magnitude of the programmed current $I_{PGM}$ may easily reach 100 microamps to 1 mA depending on the memory cell technology employed, with 400 microamps presently believed to be a preferred magnitude for an exemplary memory cell technology and array configuration. If the test memory cell 172 is successfully programmed, the programming driver within the row circuits block 104 is thus known to function adequately to decode and drive the word line 108c to a sufficiently high voltage to program the memory cell. Moreover, the word line 108c is known to be continuous across the memory array and also adequate to carry a current sufficient to program a memory cell without excessive loss of voltage before reaching the memory cell 172 at the far end of the word line 108c. In addition, confirming that the test memory cell 172 was correctly programmed preferably is accomplished by reading the cell, which exercises the row circuits block during a read mode, and also exercises the test column circuits block 106A for correct sensing of the programmed data Other memory cells along the same word line 108c may also be read to confirm that no other cells were inadvertently programmed when the test memory cell 172 was programmed.

If each test memory cell in the test bit line can be successfully programmed, this ensures that each word line is continuous (i.e., has no "opens" in it) and also confirms that each word line's programming driver is functioning properly. Moreover, it also ensures that the metallization or other conductive material forming the word line has a low enough impedance to pass an adequately high voltage all the way across the memory array to the test cell being programmed, and ether can carry enough current across the memory array to adequately program the test memory cell. Although an array having a test memory cell at the far end of each word line is contemplated in the preferred embodiment, the invention may be advantageously practiced even if only some of the word lines are provided with such a test memory cell, because the assurance level nonetheless increases as a result of programming those test memory cells that may exist.

Similarly, for each normally addressable (i.e., regular) bit line in the array, the test memory cell at the far end of the bit line, which is coupled to the test word line 108A, is programmed during the test routine, by enabling the column circuits block 106 to decode and drive the selected bit line, and by enabling the test row circuits block 104A to drive the test word line 108A, thereby programming the test memory cell coupled between the selected bit line and the test word line. If each test memory cell within the test word line 108A is successfully programmed, the programming drivers within the column circuits block 106 are known to function adequately to decode and drive each of the bit lines 110 sufficiently to program the respective test memory cell. Moreover, each bit line 110 is known to be continuous across the memory array and also adequate to carry a current sufficient to program a memory cell without excessive loss of voltage before reaching a test memory cell at the far end of the bit line. In addition, confirming that each test memory cell within the test word line 108A was correctly programmed preferably is accomplished by reading each cell, which exercises the column circuits block 106 during a read operation for correct sensing of the programmed data, and also exercises the test row circuits block 104A. Other memory cells along the same bit lines 110 may also be read to confirm that no other cells were inadvertently programmed when the test memory cells within the test word line 108A were programmed. Although an array having a test memory cell at the far end of each bit line is contemplated in the preferred embodiment, not all the bit lines are necessarily provided with a test memory cell.

If each test memory cell in the test word line 108A can be successfully programmed, this ensures that each bit line 110 is continuous and that each bit line's programming driver is functioning properly. Moreover, it also ensures that the metallization or other conductive material forming the bit line has a low enough impedance to develop an adequately high voltage across the test memory cell located all the way across the memory array, and further assures that the bit lines can carry enough current across the memory array to adequately program the test memory cells.

Recall that the earlier described shorts test would be unable to detect a short located between, for example, two adjacent word lines if the short is located beyond an open on one or both of the word lines, relative to the biasing circuitry for the word lines (which may be the word line driver circuits themselves). If the test memory cell on the far end of each word line and bit line in the array is successfully programmed, it is known that no such opens are present on any word lines or bit lines, and the shorts test described earlier can be deemed to have confirmed that no shorts exist within the entire memory array. Moreover, every programming driver circuit for both word lines and bit lines is also confirmed to be functional. If memory cells in the regular memory array are read, every bit in the array can be verified to have not been inadvertently programmed during the programming of the test memory cells, particularly since the array is then known to have no opens or shorts on either bit lines or word lines. The regular memory cells are consequently much more assured of programing correctly, even though no such memory cell was programmed during the test. Moreover, only one or two additional test word lines, out of an array having, for example, 1024 word lines are required to accommodate this test, as are an equally low number of test bit lines relative to an exemplary number of 1024 bit lines in the array.

Alternatively, the test cells may be detected without actually programming the test cells. For example, an antifuse memory cell may be biased to a voltage below that sufficient to program the memory cell, but still high enough to cause a relatively predicable characteristic current to flow through the memory cell, as described in regards to FIG. 3. The presence of the test memory cell, and the continuity of the word line and bit line associated with the test memory cell, may be confirmed by detecting such a characteristic current flowing through each unprogrammed test memory cell at the far end of the word line and/or bit line.

In addition, each regularly addressable memory cell in the array (i.e., non test memory cells) may be biased to a voltage below that sufficient to program the memory cell to determine if the characteristic current actually flows through the memory cell. The presence of each regularly addressable memory cell may be confirmed by detecting such a characteristic current flowing through each unprogrammed memory cell within the array. Normal read/sense circuitry may be used to sense this characteristic current, albeit possibly with a different reference level than used during normal reads of the array.

Figure 6:
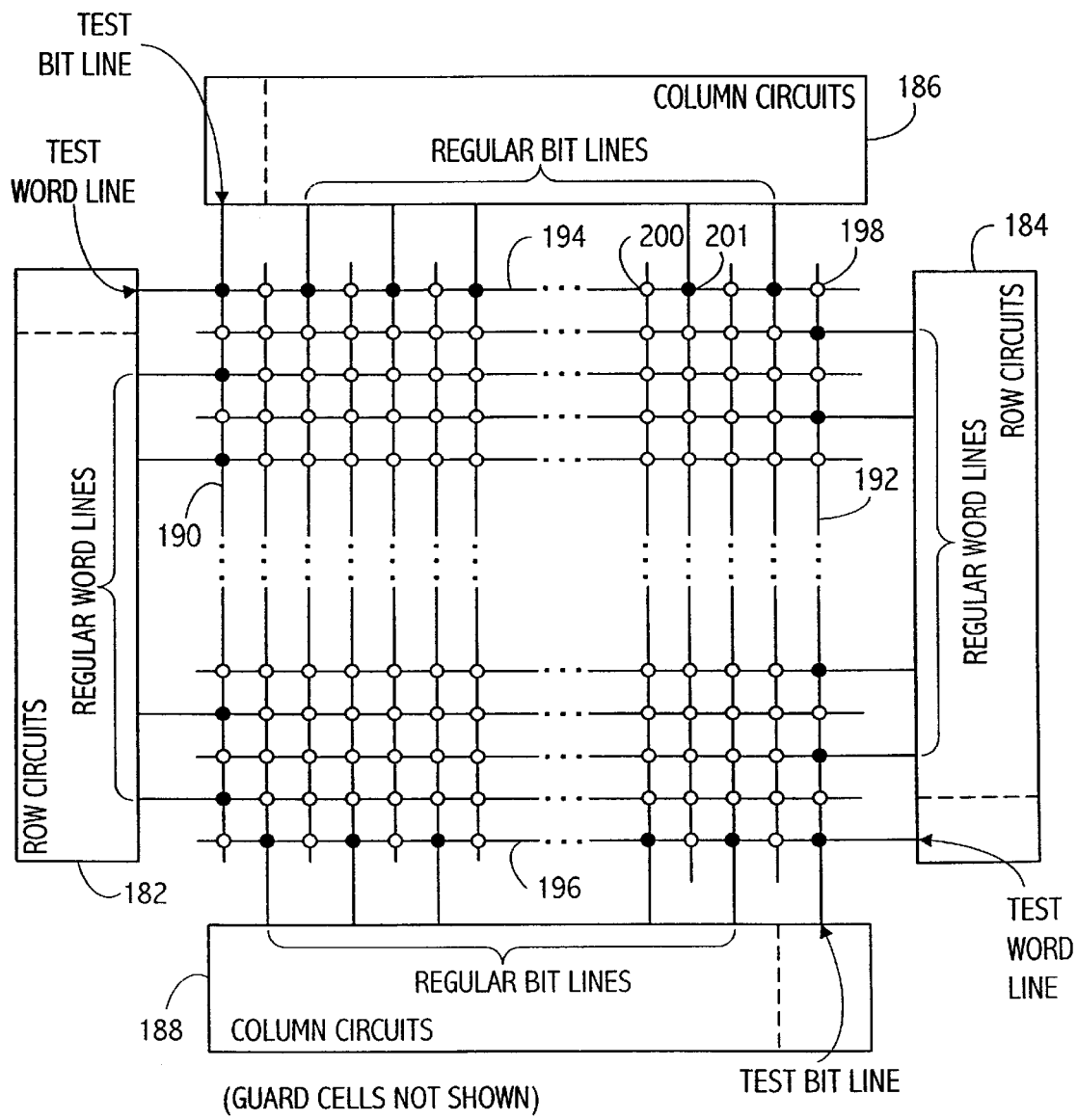
FIG. 6 is a simplified block diagram of an integrated circuit including a memory array having two test rows and two test columns in accordance with another embodiment of the present invention.

Referring now to FIG. 6, an integrated circuit layout is depicted which shows a row or column circuits block on each of the four sides of a memory array. As more fully described in U.S. Pat. No. 6,034,882, an integrated circuit 180 is depicted which includes a row circuits block 182 on the left side of the array to support half of the word lines (i.e., every other one), and further includes a row circuits block 184 on the right side of the array to support the remaining half of the word lines. The integrated circuit 180 also includes a column circuits block 186 on the top side of the array to support half of the bit lines (i.e., every other one), and further includes a column circuits block 188 on the bottom side of the array to support the remaining half of the bit lines. It should be appreciated that the designations top, left, bottom, and right are merely convenient descriptive terms for the four sides of a memory array. A first test bit line, labeled 192, is included along the right side of the array to provide a respective test memory cell at the far end of each respective word line supported by the row circuits block 182 on the left side of the array. A second test bit line, labeled 190, is included along the left side of the array to provide a respective test memory cell at the far end of each respective word line supported by the row circuits block 184 on the right side of the array. Similarly, a first test word line, labeled 194, is included along the top of the array to provide a respective test memory cell at the far end of each respective bit line supported by the column circuits block 188 on the bottom of the array. A second test word line, labeled 196, is included along the bottom of the array to provide a respective test memory cell at the far end of each respective bit line supported by the column circuits block 186 on the top side of the array.

Referring to the test word line 194 along the top side of the array, a test memory cell is provided at the far end of each bit line that is supported by the column circuits block 188 on the opposite side of the array. The test memory cell labeled 200 is one such example. The adjacent test memory cell 201 is formed between the test word line 194 and the near end of a bit line supported by the column circuits block 186 on the same side of the array as the test word line 194. Such a near end test memory cell may be used to determine whether the programming driver circuitry is functioning independently of whether an open is present in the associated array terminal line (in this case a bit line). Even though not as useful in ensuring array terminal continuity, such near end test memory cells (each indicated in FIG. 6 by a solid circle) are preferably implemented to preserve memory cell uniformity within the array, as are guard cells (not shown in FIG. 6).

Figure 7:
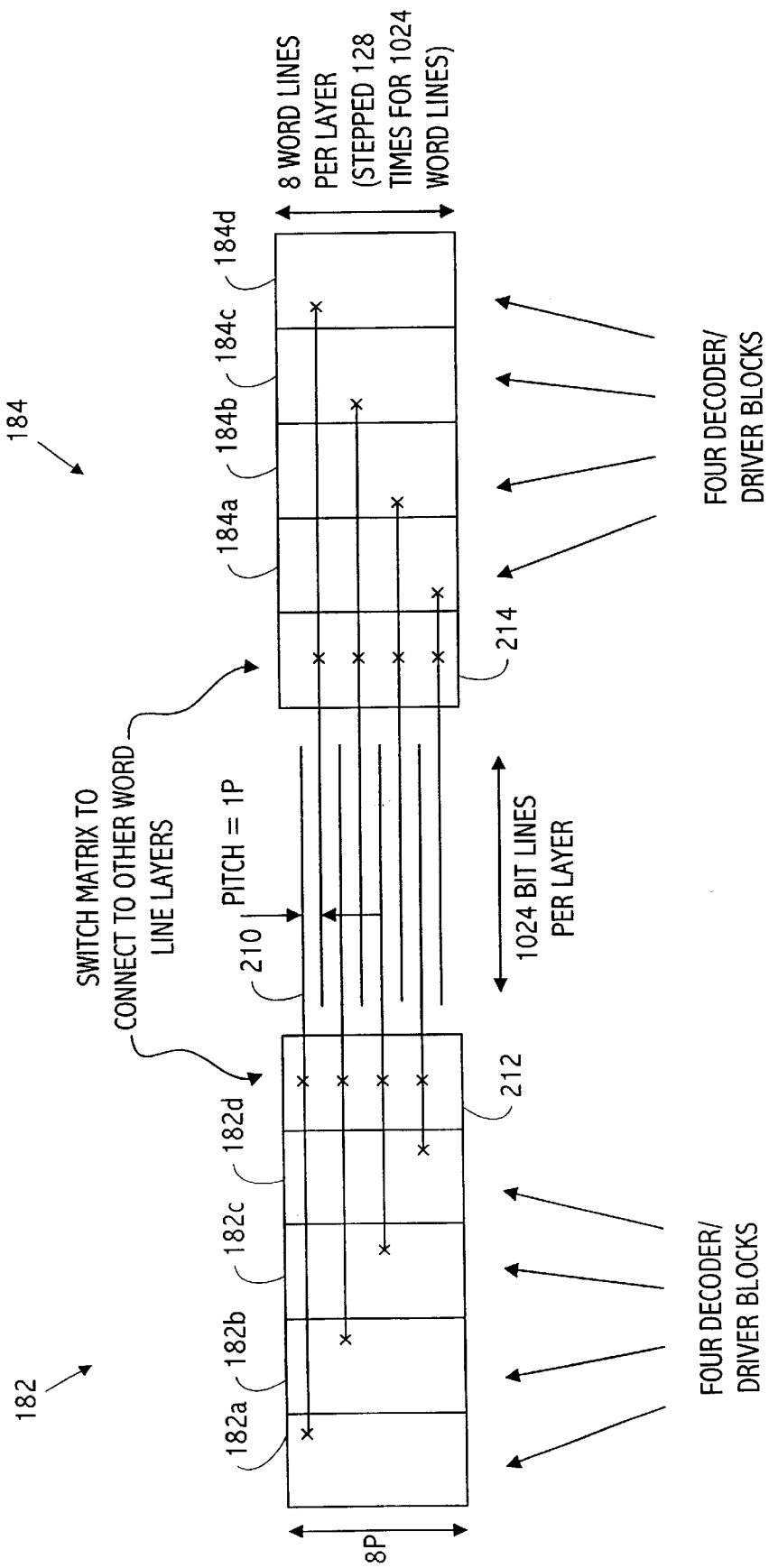
FIG. 7 is a block diagram of a row circuits block useful for the integrated circuit depicted in FIG. 6.

Referring now to FIG. 7, a preferred arrangement is depicted for achieving a tight word line pitch using two row circuits blocks, each on opposite sides of the array. Eight word lines are depicted, four being supported by the row circuits block 182 on the left side of the array, and the other four being supported by the row circuits block 184 on the right side of the array. The illustrated portion of the row circuits block 182 includes four decoder/driver blocks 182a, 182b, 182c, and 182d, each associated with a separate row. A switch block 212 is also provided to connect the output of a given decoder/driver block to other word lines (on other layers) of the corresponding row. Only one such layer of word lines for the various rows are shown in FIG. 7. Preferred arrangements for connecting to other memory cell layers is described in U.S. Pat. No. 6,034,882. The illustrated portion of the row circuits block 184 includes four decoder/driver blocks 184a, 184b, 184c, and 184d, each associated with a separate row. A switch block 214 is likewise provided to connect the output of a given decoder/driver block to other word line layers for the corresponding row.

Figure 8:
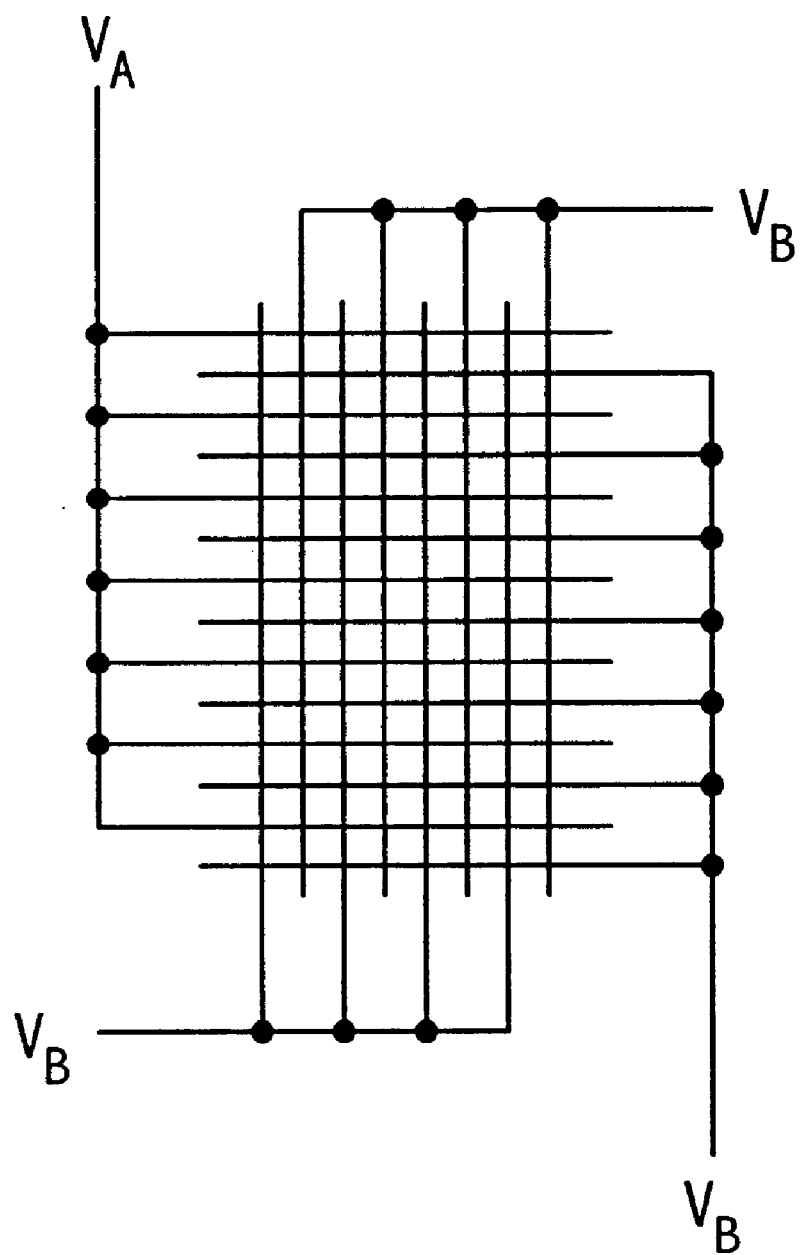
FIG. 8 is a simplified block diagram depicting an advantageous word line and bit line biasing configuration, in accordance with an embodiment of the present invention.

In the configuration as depicted in FIG. 6 which utilizes a pair of row circuit blocks, each supporting every other word line (or row), and which further utilizes a pair of column circuit blocks, each supporting every other bit line (or column), each word line may be biased to a voltage different from its adjacent word lines by driving all of the word lines associated with one of the row circuit blocks to a first bias voltage, and driving all of the word lines associated with the other row circuit blocks to a second bias voltage. Referring now to FIG. 8, the word lines supported by the left side row circuits block are depicted being biased to a first bias voltage $V_A$, while the word lines supported by the right side row circuits block are depicted being biased to a second bias voltage $V_B$. This may likely be accomplished utilizing the word line drivers already provided in the row circuits block, without necessarily requiring separate switches which were conceptually described in regards to FIG. 2.

Both the group of bit lines supported by the column circuits block at the top of the array and the group of bit lines supported by the column circuits block at the bottom of the array are shown as being biased to the second bias voltage $V_B$ so that a "shorts" test described earlier may be accomplished to determine whether any of the left-side word lines are shorted to any of the bit lines.

The above described techniques together, or alone, may be used to help determine the number and even the location of defective memory cells within an array. A decision as to whether or not to scrap the circuit may thus be facilitated. Such a decision may depend upon the arrangement of data bits within a memory array. For example, in an exemplary embodiment of an integrated circuit including a three-dimensional write-once memory array, the array is divided into 72 sub-arrays. Eight error correction check/syndrome bits are concatenated to each 64 bit data word to generate a 72-bit ECC data word. Preferably each bit of this 72-bit ECC data word is written physically into a different corresponding one of the 72 sub-arrays. Additional details of this exemplary embodiment are described in commonly-assigned, co-pending U.S. patent application Ser. No. 09/747,574, entitled "Three-Dimensional Memory Array and Method for Storing Data Bits and ECC Bits Therein," filed on Dec. 22, 2000, naming Thomas H. Lee, James M. Cleeves, and Mark G. Johnson as inventors, which application is incorporated herein by reference in its entirety, and further described in commonly-assigned, co-pending U.S. patent application Ser. No. 09/748,649, entitled "Partial Selection of Passive Element Memory Cell Sub-Arrays for Write Operation," filed on Dec. 22, 2000, naming Roy E. Scheuerlein and Matthew P. Crowley as inventors, which application is incorporated herein by reference in its entirety. In such an exemplary arrangement, a circuit having a completely defective sub-array, or an entirely defective memory cell layer within a sub-array will only affect one bit of the ECC word, even though from the sub-array perspective, the defect affects many adjacent bits. Consequently, such a defective circuit could be correctly programmed because the ECC capability will correct a single bit error, and with this data organization these kinds of defects affect only one bit per 72-bit ECC word. Nonetheless, such a defective circuit may preferably be scrapped. In contrast, a circuit having just a defective word line in a sub-array, or a defective bit line in a sub-array, may more plausibly be passed by the test and be available for product shipment. In addition, determining the leakage current through each unprogrammed antifuse memory cell (as described above) may be used to help determine the dimensions of an interlayer short to determine if enough bits are affected to scrap the circuit. The testing of 72 such sub-arrays is advantageously performed in parallel to conserve test time.

Alternatively, a number of sub-arrays other than 72 may be implemented, and more than one bit per ECC word may be stored into each sub-array. For example, in some embodiments 2–8 bits per ECC word may be stored into each sub-array.

Figure 9:
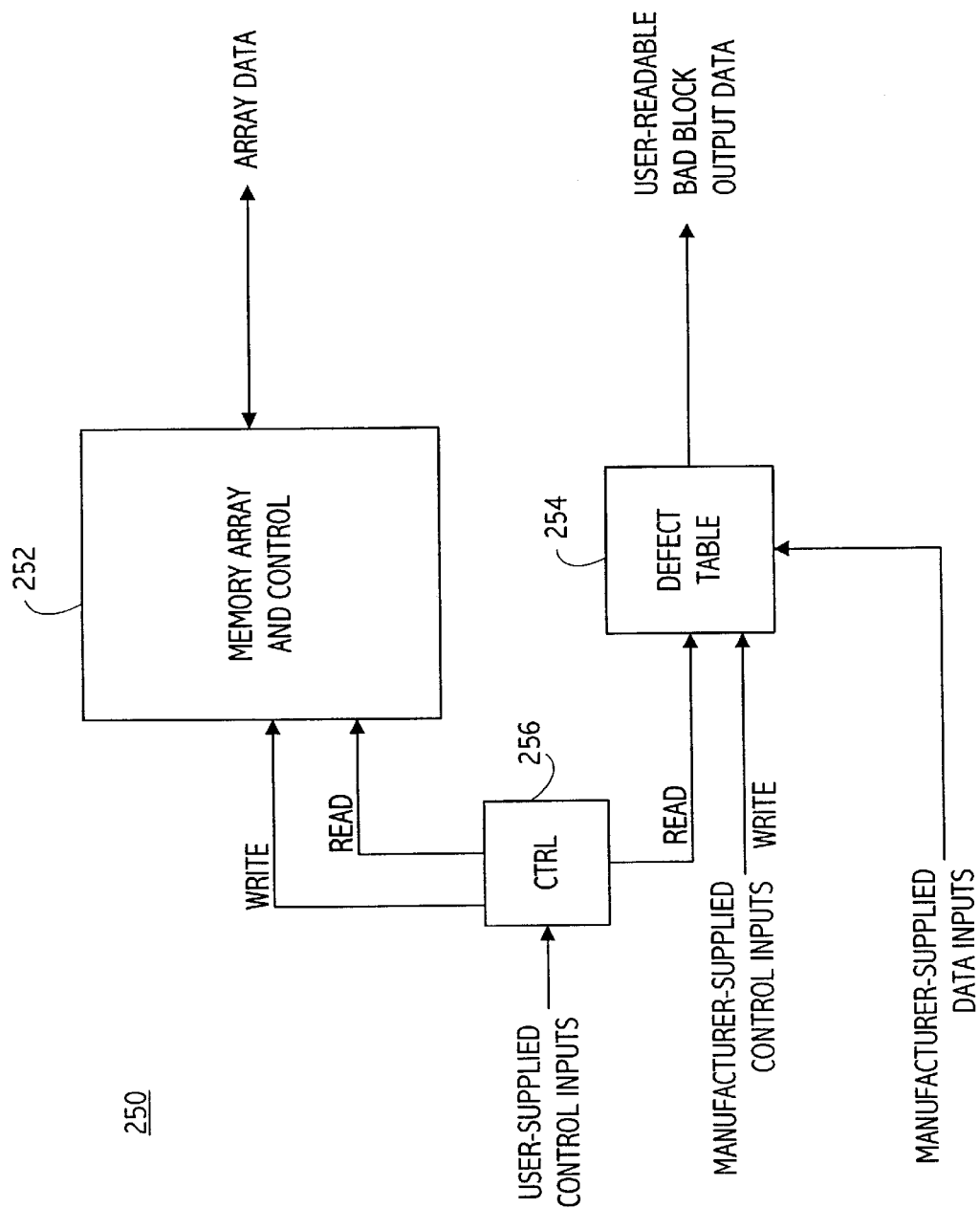
FIG. 9 is a block diagram of an integrated circuit including a memory array, and further including a defect table.

In an exemplary circuit embodiment, the memory array defect information, once determined by the manufacturer, may be written into a defect table provided on-chip. This defect table may subsequently be read by an end user of the circuit to determine which portions of the array should not be used, such as defective blocks, pages, or some other suitably-identifiable portion of the array. Referring now to FIG. 9, a conceptual block diagram of an integrated circuit 250 is depicted which includes a memory array 252 (and associated control) and a defect table 254. Manufacturer-provided control and data inputs are received to write the defect information into the defect table 254. User-provided control inputs are provided to read the defect table 254, as well as to read and write the memory array 252. The defect table 254 is preferably a one-time programmable memory structure, but the memory array 252 may advantageously be implemented as a one-time programmable memory array or as an erasable memory array.

Figure 10:
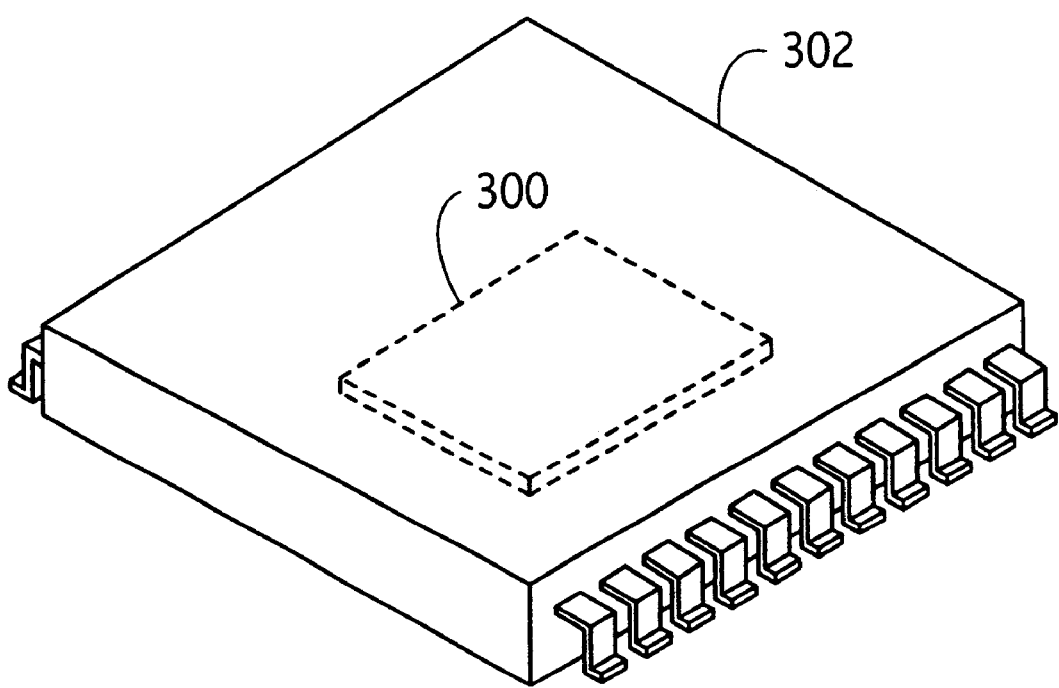
FIG. 10 is a three-dimensional drawing of a packaged integrated circuit. The use of the same reference symbols in different drawings indicates similar or identical items.

Referring now to FIG. 10, an integrated circuit 300 in accordance with the present invention is depicted within a semiconductor package 302. Many packaging techniques and materials are well known in the art. Many available packaging materials are opaque to various wavelengths of light. Suitable packaging material may be chosen to prevent the erasure of memory cells therewithin, even if such memory cells are implemented using a fundamentally erasable memory cell technology, such as ultra-violet erasable programmable read-only-memory (i.e., UV EPROM) memory cells. Alternatively, a device such as a flash EEPROM could be tested by reading and erasing various bits, then could be programmed to disable subsequent erase commands. As another alternative, such a device may be packaged without bringing all electrical signals (e.g., I/O pins) to a corresponding external package pin so that an erase command, otherwise available and used for testing of the die, is lost when packaged. Other memory cell technologies which are fundamentally erasable may be incorporated within a device which, as to a user thereof, appears to be a write-once memory if such memory cells are prevented from erasure or further programming.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, the invention is not necessarily limited to any particular memory cell technology, or to any particular arrangement of sub-arrays. In particular, even though the preferred embodiments are described in the context of a passive element memory array, the teachings of the present invention are believed advantageous for use with other types of memory cells, such as certain 3-terminal memory cells. Moreover, while non-volatile memory arrays incorporating antifuse memory cells are believed to be particularly advantageous for use with the present invention, other non-volatile memory arrays, such as those incorporating fuse memory cells, may also be used. Moreover, while certain embodiments have been described in the context of a three-dimensional, field-programmable, write once memory array, it should be appreciated that such an array is not necessarily required unless specifically enumerated in a particular claim. Accordingly, other embodiments, variations, and improvements not described herein are not necessarily excluded from the scope of the invention, which is defined by the following appended claims.

The invention is not contemplated to be limited to traditional silicon semiconductor technologies, as other suitable semiconductor technologies, such as gallium arsenide, silicon carbide, indium phosphide, as well as certain organic structures, may take advantage of the teachings herein.

The various test modes and signals may be enabled in any of a variety of suitable ways, such as using dedicated I/O pins which are accessible only during die-level (or wafer level) testing to control the test sequence, or by using invalid combinations of control inputs which are available after packaging, or by some other technique.

As used herein, a regular memory cell is one which is customarily selectable, for both programming (writing) and reading, by the usual decoding of address inputs provided to the integrated circuit by an end user of the integrated circuit, and without any special test mode being entered. A regular memory cell is coupled between a regular word line and a regular bit line. A test memory cell is coupled to either a test word line or to a test bit line (or both). The test word line(s) and test bit line(s) are preferably only selectable during a test sequence, although the regular word lines and regular bit lines may also be selected during a test sequence, as described above. The test memory cells described here are preferably implemented to be as identical to regular memory cells as possible. Nonetheless, it may be advantageous to implement the test memory cells intentionally "weaker" or harder to program, to provide some test margin.

As used herein, an adjacent structure may be either laterally adjacent and/or vertically adjacent.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, sensing circuits, drivers, $V_{PP}$ voltage sources, current detectors, multiplexers, input/output buffers, etc.) are not specifically described, such circuits are well known, and no particular advantage is believed to be afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation.

As used herein, a passive element memory array includes a plurality of 2-terminal memory cells, each connected between an associated X-line and an associated Y-line. Such a memory array may be planar or may be a three-dimensional array having more than one plane (or level) of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may increase when the memory cell incorporates a fuse technology, or may decrease when the memory cell incorporates an antifuse technology. A passive element memory array is not necessarily a one-time programmable (i.e., write once) memory array.

Certain passive element memory cells incorporate layers of organic materials including at least one layer that has a diode-like characteristic conduction and at least one organic material that changes conductivity with the application of an electric field.

General Terminology

Regarding general terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. It may be correct to think of signals being conveyed on wires or buses. For example, one might describe a particular circuit operation as "the output of circuit 10 drives the voltage of node 11 toward VDD, thus asserting the signal OUT conveyed on node 11." This is an accurate, albeit somewhat cumbersome expression. Consequently, it is well known in the art to equally describe such a circuit operation as "circuit 10 drives node 11 high," as well as "node 11 is brought high by circuit 10," "circuit 10 pulls the OUT signal high" and "circuit 10 drives OUT high." Such shorthand phrases for describing circuit operation are more efficient to communicate details of circuit operation, particularly because the schematic diagrams in the figures clearly associate various signal names with the corresponding circuit blocks and node names. For convenience, an otherwise unnamed node conveying the CLK signal may be referred to as the CLK node. Similarly, phrases such as "pull high," "drive high," and "charge" are generally synonymous unless otherwise distinguished, as are the phrases "pull low," "drive low," and "discharge." It is believed that use of these more concise descriptive expressions enhances clarity and teaching of the disclosure. It is to be appreciated by those skilled in the art that each of these and other similar phrases may be interchangeably used to describe common circuit operation, and no subtle inferences should be read into varied usage within this description.

As an additional example, a logic signal has an active level and an inactive level (at least for traditional binary logic signals) and the active and inactive levels are sometimes also respectively called active and inactive "states." The active level for some logic signals is a high level (i.e., an "active-high" signal) and for others is a low level (i.e., an "active-low" signal). A logic signal is "asserted" or "activated" when driven to the active level. Conversely, a logic signal is "de-asserted" or "de-activated" when driven to the inactive level. A high logic level is frequently referred to as a logic "1" and a low logic level is frequently referred to as a logic "0" (at least for positive logic).

Frequently logic signals are named in a fashion to convey which level is the active level. For example, CLKEN is commonly used to name an active-high clock enable signal, because the true polarity is implied in the name. Conversely, CLKENB, /CLKEN, CLKEN#, CLKEN*, CLKEN_L, CLKEN_C, or #CLKEN are commonly used to name an active-low clock enable signal, because one of the many common expressions indicating the complement polarity is used in the name. It is to be appreciated by those skilled in the art that these and other similar phrases may be used to name the signals and nodes. The schematic diagrams and accompanying description of the signals and nodes should in context be clear.

Regarding power supplies, a single positive power supply voltage (e.g., a 2.5 volt power supply) used to power a circuit is frequently named the "VDD" power supply. In an integrated circuit, transistors and other circuit elements are actually connected to a VDD terminal or a VDD node, which is then operably connected to the VDD power supply. The colloquial use of phrases such as "tied to VDD" or "connected to VDD" is understood to mean "connected to the VDD node" which is typically then operably connected to actually receive the VDD power supply voltage during use of the integrated circuit. The term may appear either using subscripts (e.g., $V_{DD}$) or not.

The reference voltage for such a single power supply circuit is frequently called "VSS." Transistors and other circuit elements are actually connected to a VSS terminal or a VSS node, which is then operably connected to the VSS power supply during use of the integrated circuit. Frequently the VSS terminal is connected to a ground reference potential, or just "ground." Describing a node which is "grounded" by a particular transistor or circuit (unless otherwise defined) means the same as being "pulled low" or "pulled to ground" by the transistor or circuit. Describing a circuit as functioning with a "VDD supply" and "ground" does not necessarily mean the circuit cannot function using other power supply potentials.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. Accordingly, other embodiments, variations, and improvements not described herein are not necessarily excluded from the scope of the invention, which is defined by the following appended claims.

What is claimed is:

1. A test method for an integrated circuit including a memory array of programmable memory cells, said method comprising the steps of:
    verifying that each respective one of a plurality of array lines of the memory array has continuity across the memory array;
    biasing each respective one of the plurality of array lines, in groups of at least one array line at a time, to a voltage different from that of its adjacent array lines;
    determining whether leakage current exceeding a predetermined value is supported by a group of biased array lines; and
    qualifying at least one attribute of the memory array based upon the leakage current determinations.

2. The method as recited in claim 1:
    wherein the biasing step comprises biasing each respective bit line of the plurality of array lines, in groups of at least one bit line at a time, to a voltage different from that of its respectively adjacent bit lines; and
    wherein the at least one attribute of the memory array includes whether an intra-level short exists between adjacent bit lines.

3. The method as recited in claim 2 Wherein the bit lines are sequentially biased in groups of one bit line at a time.

4. The method as recited in claim 2 wherein every other bit line of each respective group is respectively biased simultaneously to a first voltage, while remaining bit lines of each respective group are biased to a second voltage different from the first voltage.

5. The method as recited in claim 2 wherein the biasing step comprises: simultaneously biasing approximately half the bit lines to a first voltage, and the remaining bit lines to a second voltage different from the first voltage.

6. The method as recited in claim 1 further comprising:
    verifying, in groups of at least one word line, that each respective word line has continuity across the entire memory array; and
    verifying, in groups of at least one bit line, that each respective bit line has continuity across the entire memory array; and
    wherein the at least one attribute of the memory array includes whether an open circuit exists on at least one of the group of word lines and whether an open circuit exists on at least one of the group of bit lines.

7. The method as recited in claim 1 further comprising:
    verifying, in groups of at least one word line, that each respective word line can carry at least a predetermined magnitude of current across the entire memory array; and
    verifying, in groups of at least one bit line, that each respective bit line can carry at least a predetermined magnitude of current across the entire memory array;
    wherein the at least one attribute of the memory array includes whether each of the group of word lines and each of the group of bit lines has at least a predetermined current-carrying capacity.

8. The method as recited in claim 1 wherein the verifying step is performed before the biasing step for at least one group of at least one array line.

9. The method as recited in claim 1 wherein the verifying step is performed after the determining step for at least one group of at least one array line.

10. The method as recited in claim 1 wherein the verifying step, for at least a first group of at least one array line, is performed after the determining step for at least a second group of at least one array line is performed.

11. The method as recited in claim 1 wherein: the memory array is a one-time programmable array.

12. The method as recited in claim 1 wherein: the memory array is three-dimensional array having at least two planes of memory cells.

13. A test method for an integrated circuit including a memory array of programmable memory cells, said test method comprising the steps of:
    biasing each respective one of a plurality of array lines of the memory array, in groups of at least one array line at a time, to a voltage different from that of its adjacent array lines;
    determining whether leakage current exceeding a predetermined value is supported by a group of biased array lines; and
    qualifying at least one attribute of the memory array based upon the leakage current determinations;
    wherein the biasing step comprises biasing each respective word line of the plurality of array lines, in groups of at least one word line at a time, to a voltage different from that of its respectively adjacent word lines; and
    wherein the at least one attribute of the memory array includes whether an intra-level short exists between adjacent word lines.

14. The method as recited in claim 13 wherein the word lines are sequentially biased in groups of one word line at a time.

15. The method as recited in claim 13 wherein every other word line of each respective group is respectively biased simultaneously to a first voltage, while remaining word lines of each respective group are biased to a second voltage different from the first voltage.

16. The method as recited in claim 13 wherein the biasing step comprises: simultaneously biasing approximately half the word lines to a first voltage, and the remaining word lines to a second voltage different from the first voltage.

17. A test method for an integrated circuit including a memory array of programmable memory cells, said test method comprising the steps of:
  biasing each respective one of a plurality of array lines of the memory array, in groups of at least one array line at a time, to a voltage different from that of its adjacent array lines;
  determining whether leakage current exceeding a predetermined value is supported by a group of biased array lines; and
  qualifying at least one attribute of the memory array based upon the leakage current determinations;
  wherein the biasing step comprises biasing each respective word line of the plurality of array lines, in groups of at least one word line at a time, to a voltage different from that of bit lines on an adjacent level of the memory array which cross the group of word lines; and
  wherein the at least one attribute of the memory array includes whether a short exists between at least one of the group of word lines and a bit line which crosses the group of word lines.

18. An integrated circuit comprising:
  a memory array of programmable memory cells, each respectively coupled to an associated pair of array lines of the memory array;
  means for verifying that each respective one of a plurality of array lines has continuity across the memory array;
  terminal circuitry for biasing each respective one of the plurality of array lines, in groups of at least one array line at a time, to a voltage different from that of its adjacent array lines, and for determining whether a current exceeding a predetermined value flows between adjacent array lines as a result.

19. The invention as recited in claim 18 wherein the terminal circuitry is configurable to bias each respective word line of the plurality of array lines, in groups of at least one word line at a time, to a voltage different from that of its respectively adjacent word lines.

20. The invention as recited in claim 19 wherein the word lines are sequentially biased in groups of one word line at a time.

21. The invention as recited in claim 19 wherein every other word line of each respective group is respectively biased simultaneously to a first voltage, while remaining word lines of each respective group are biased to a second voltage different from the first voltage.

22. The invention as recited in claim 19 wherein approximately half the word lines are simultaneously biased to a first voltage and the remaining word lines simultaneously biased to a second voltage different from the first voltage.

23. The invention as recited in claim 18 wherein the terminal circuitry is configurable to bias each respective bit line of the plurality of array lines, in groups of at least one bit line at a time, to a voltage different from that of its respectively adjacent bit lines.

24. The invention as recited in claim 23 wherein the bit lines are sequentially biased in groups of one bit line at a time.

25. The invention as recited in claim 23 wherein every other bit line of each respective group is respectively biased simultaneously to a first voltage, while remaining bit lines of each respective group are biased to a second voltage different from the first voltage.

26. The invention as recited in claim 23 wherein approximately half the bit lines are simultaneously biased to a first voltage and the remaining bit lines simultaneously biased to a second voltage different from the first voltage.

27. The invention as recited in claim 18 wherein: the memory array is a one-time programmable array.

28. The invention as recited in claim 27 wherein: the memory array is three-dimensional array having at least two planes of memory cells.

29. The invention as recited in claim 18 wherein the means for verifying comprises:
  a test array line for the array;
  a plurality of test memory cells, each respectively connected between a respective array line and the test array line, each respectively connected to its respective array line on an opposite side of the memory array relative to a respective terminal circuit for the respective array line;
  means for biasing each respective one of the plurality of array lines, in groups of at least one array line at a time, to a voltage different from that of the test array line, and for determining whether a current is caused to flow through the respective test memory cell as a result.

30. The invention as recited in claim 29 wherein every respective array line has a respective test memory cell connected thereto.

31. The invention as recited in claim 29 wherein the means for biasing impresses a particular voltage across each test memory cell sufficient to program the test memory cell.

32. The invention as recited in claim 29 wherein the means for biasing impresses a particular voltage across each test memory cell below that sufficient to program the test memory cell.

33. The invention as recited in claim 18 wherein the means for verifying comprises:
  at least one test word line and at least one test bit line for the array;
  a first plurality of test memory cells, each respectively connected between a respective word line and an associated one of the at least one test bit line, each respectively connected to its respective word line on an opposite side of the memory array relative to a respective terminal circuit for the respective word line;
  a second plurality of test memory cells, each respectively connected between a respective bit line and an associated one of the at least one test word line, each respectively connected to its respective bit line on an opposite side of the memory array relative to a respective terminal circuit for the respective bit line;
  means for biasing, for each respective test memory cell, the associated word line or test word line to a voltage different from that of the associated bit line or test bit line, and for determining whether a current is caused to flow through the respective test memory cell as a result.

34. The invention as recited in claim 33 wherein the means for verifying comprises at least two test word lines, each located on an opposite side of the memory array than the other, and at least two test bit lines for the array, each located on an opposite side of the memory array than the other.

35. The invention as recited in claim 33 wherein:
  every respective word line has a respective test memory cell connected thereto; and every respective bit line has a respective test memory cell connected thereto.

36. The invention as recited in claim 33 wherein the means for biasing impresses a particular voltage across a given test memory cell sufficient to program the test memory cell.

37. The invention as recited in claim 33 wherein the means for biasing impresses a particular voltage across a given test memory cell below that sufficient to program the test memory cell.

38. An integrated circuit comprising:

a memory array of programmable memory cells;

means for verifying that each array line of the memory array has continuity across the memory array; and means for biasing each array line to a voltage different from that of its adjacent array lines, and for determining whether a current exceeding a predetermined value flows between adjacent array lines as a result.

39. The invention as recited in claim 38 wherein: the memory array is a one-time programmable array.

40. The invention as recited in claim 38 wherein: the memory array is three-dimensional array having at least two planes of memory cells.

* * * * *